United States Patent
Noh et al.

(10) Patent No.: US 9,142,498 B2
(45) Date of Patent: Sep. 22, 2015

(54) SEMICONDUCTOR DEVICES HAVING STACKED SOLDER BUMPS WITH INTERVENING METAL LAYERS TO PROVIDE ELECTRICAL INTERCONNECTIONS

(71) Applicants: Boin Noh, Suwon-si (KR); Yonghwan Kwon, Suwon-si (KR); Sun-Hee Park, Seoul (KR)

(72) Inventors: Boin Noh, Suwon-si (KR); Yonghwan Kwon, Suwon-si (KR); Sun-Hee Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/917,000

(22) Filed: Jun. 13, 2013

(65) Prior Publication Data
US 2014/0035131 A1    Feb. 6, 2014

(30) Foreign Application Priority Data
Jul. 31, 2012    (KR) .................. 10-2012-0084076

(51) Int. Cl.
*H01L 23/498*    (2006.01)
*H01L 23/00*    (2006.01)
(Continued)

(52) U.S. Cl.
CPC ......... *H01L 23/49811* (2013.01); *H01L 24/03* (2013.01); *H01L 24/05* (2013.01); *H01L 24/11* (2013.01); *H01L 24/13* (2013.01); *H01L 21/563* (2013.01); *H01L 23/3128* (2013.01); *H01L 23/49816* (2013.01); *H01L 24/81* (2013.01); *H01L 2224/0345* (2013.01); *H01L 2224/0347* (2013.01); *H01L 2224/03462* (2013.01); *H01L 2224/03464* (2013.01); *H01L 2224/03912* (2013.01); *H01L 2224/03914* (2013.01); *H01L 2224/0401* (2013.01); *H01L 2224/05082* (2013.01); *H01L 2224/05124* (2013.01); *H01L 2224/05147* (2013.01); *H01L 2224/05155* (2013.01); *H01L 2224/05166* (2013.01); *H01L 2224/05171* (2013.01); *H01L 2224/05558* (2013.01); *H01L 2224/05561* (2013.01);
(Continued)

(58) Field of Classification Search
CPC ............... H01L 23/49811; H01L 23/49816; H01L 24/14; H01L 24/17; H01L 23/00
USPC ................... 257/734, 737, 738, 778
See application file for complete search history.

(56) References Cited

U.S. PATENT DOCUMENTS 5,376,584 A * 12/1994 Agarwala .................. 438/614
6,569,752 B1 * 5/2003 Homma et al. ............ 438/597
(Continued)

FOREIGN PATENT DOCUMENTS

JP    08-078474    3/1996
JP    11-186324    7/1999
(Continued)

OTHER PUBLICATIONS

Gerber et al., "Next Generation Fine Pitch Cu Pillar Technology—Enable Next Generation Silicon Nodes", 2011 Electronic Components and Technology Conference.
(Continued)

*Primary Examiner* — Alexander Oscar Williams
(74) *Attorney, Agent, or Firm* — Myers Bigel Sibley & Sajovec, P.A.

(57) ABSTRACT

An electrical interconnection can be provided using a bump stack including at least two solder bumps which are stacked on one another and at least one intermediate layer interposed between the at least stacked two solder bumps.

18 Claims, 22 Drawing Sheets

(51) Int. Cl.
*H01L 23/31* (2006.01)
*H01L 21/56* (2006.01)

(52) U.S. Cl.
CPC ............ *H01L2224/05562* (2013.01); *H01L 2224/05655* (2013.01); *H01L 2224/1147* (2013.01); *H01L 2224/11849* (2013.01); *H01L 2224/131* (2013.01); *H01L 2224/1308* (2013.01); *H01L 2224/13017* (2013.01); *H01L 2224/13018* (2013.01); *H01L 2224/13083* (2013.01); *H01L 2224/13109* (2013.01); *H01L 2224/13111* (2013.01); *H01L 2224/13155* (2013.01); *H01L 2224/16* (2013.01); *H01L 2224/16227* (2013.01); *H01L 2224/73204* (2013.01); *H01L 2224/81011* (2013.01); *H01L 2224/81191* (2013.01); *H01L 2224/81801* (2013.01); *H01L 2924/00014* (2013.01); *H01L 2924/351* (2013.01); *H01L 2924/3512* (2013.01); *H01L 2924/381* (2013.01)

(56) References Cited

U.S. PATENT DOCUMENTS

| | | | |
|---|---|---|---|
| 6,780,751 B2 | 8/2004 | Fay | |
| 8,072,070 B2 | 12/2011 | Lee et al. | |
| 2002/0104873 A1* | 8/2002 | Lee et al. | 228/180.22 |
| 2003/0155408 A1* | 8/2003 | Fanti et al. | 228/215 |
| 2005/0214971 A1* | 9/2005 | Hung | 438/106 |
| 2008/0012131 A1* | 1/2008 | Tanaka | 257/738 |
| 2008/0067677 A1* | 3/2008 | Lin et al. | 257/738 |
| 2009/0011402 A1* | 1/2009 | Lu et al. | 435/5 |
| 2009/0096092 A1* | 4/2009 | Patel | 257/737 |
| 2009/0233117 A1* | 9/2009 | Sakai et al. | 428/551 |
| 2009/0293906 A1* | 12/2009 | Baddeley | 134/1 |
| 2009/0296364 A1* | 12/2009 | Yamamoto | 361/820 |
| 2010/0032194 A1 | 2/2010 | Kato | |
| 2010/0230810 A1 | 9/2010 | Kang et al. | |
| 2010/0252926 A1* | 10/2010 | Kato et al. | 257/738 |
| 2011/0074020 A1* | 3/2011 | Yamakami et al. | 257/737 |
| 2011/0079896 A1* | 4/2011 | Satoh et al. | 257/737 |
| 2011/0101519 A1 | 5/2011 | Hsiao et al. | |
| 2011/0147927 A1* | 6/2011 | Hagihara | 257/737 |
| 2011/0156253 A1 | 6/2011 | Tsai et al. | |
| 2011/0186989 A1* | 8/2011 | Hsiao et al. | 257/737 |
| 2011/0193223 A1* | 8/2011 | Ozaki et al. | 257/737 |
| 2012/0223433 A1* | 9/2012 | Jee et al. | 257/772 |
| 2013/0088839 A1* | 4/2013 | Yamakami et al. | 361/728 |
| 2013/0307144 A1* | 11/2013 | Yu et al. | 257/737 |
| 2013/0313707 A1* | 11/2013 | Choi et al. | 257/738 |
| 2014/0063768 A1* | 3/2014 | Tanaka et al. | 361/784 |

FOREIGN PATENT DOCUMENTS

| | | |
|---|---|---|
| JP | 2007-234841 | 9/2007 |
| KR | 10-2000-0042665 A | 7/2000 |
| KR | 10-2001-0093957 A | 10/2001 |
| KR | 10-2006-0074705 A | 7/2006 |
| KR | 10-2007-0053555 A | 5/2007 |
| KR | 10-0762354 B1 | 9/2007 |
| KR | 10-2011-0097329 A | 8/2011 |

OTHER PUBLICATIONS

Aggarwal et al., "Metal-Polymer Composite Interconnections for Ultra Fine-Pitch Wafer Level Packaging", *IEEE Transactions on Advanced Packaging*, vol. 30, No. 3, Aug. 2007.

* cited by examiner

SEMICONDUCTOR DEVICES HAVING STACKED SOLDER BUMPS WITH INTERVENING METAL LAYERS TO PROVIDE ELECTRICAL INTERCONNECTIONS

CROSS-REFERENCE TO RELATED APPLICATIONS

This U.S. nonprovisional patent application claims priority under 35 U.S.C. §119 of Korean Patent Application 10-2012-0084076 filed on Jul. 31, 2012, the entire contents of which are hereby incorporated by reference.

BACKGROUND

The present inventive concept relates to semiconductor devices and, more particularly, to semiconductor devices having multi-bump structural electrical interconnections and methods for fabricating the same.

Generally, the semiconductor device has an electrical interconnection to electrically interconnect to different semiconductor device or package substrate. Therefore, there may be needed an electrical interconnection of the semiconductor device for reliable and stable electrical interconnection

SUMMARY

According to exemplary embodiments of the present inventive concepts, a method for fabricating a semiconductor device may comprise: providing a substrate including a chip pad; forming on the substrate a solder stack including at least two solder layers which are stacked and at least one intermediate layer interposed between the at least two solder layers; and reflowing the solder stack to form a bump stack that is electrically connected to the chip pad, the bump stack including at least two solder bumps which are stacked and the at least one intermediate layer interposed between the at least two solder bumps.

In some exemplary embodiments, forming the solder stack may comprise: forming a mask layer including an opening therein on the substrate; forming a first solder layer, the intermediate layer and a second solder layer which are stacked one atop the other in the foregoing sequence in the opening; and removing the mask layer.

In other exemplary embodiments, the first and second solder layers may be formed by electroplating the same solder.

In still other exemplary embodiments, one of the first and second solder layers may be formed by electroplating solder that has a melting point greater than that of solder for forming the other.

In even other exemplary embodiments, the intermediate layer may be formed by electroplating or depositing noble or high melting point metal compared to metal for forming at least one of the first and second solder layers.

In yet other exemplary embodiments, forming the bump stack may comprise: reflowing the first solder layer to form a first solder bump on a bottom surface of the intermediate layer; and reflowing the second solder layer to form a second solder bump on a top surface of the intermediate layer.

In further exemplary embodiments, at least one of the first and second solder bumps may be formed to have a bead or pillar shape.

In still further exemplary embodiments, one of the first and second solder bumps may be formed to have a bead shape and the other is formed to have a pillar shape.

In even further exemplary embodiments, the intermediate layer may be formed to have a flat disk shape wherein at least one of the bottom and top surfaces of the intermediate layer is even and a side surface connecting the bottom surface to the top surface is vertical.

According to exemplary embodiments of the present inventive concepts, a semiconductor device may comprise a bump stack that is electrically connected to a chip pad formed on a substrate. The bump stack may comprise: a first solder bump and a second solder bump which are stacked on the chip pad; and a metal layer interposed between the first and second solder bumps. The metal layer may have a melting point greater than the first and second solder bumps.

In some exemplary embodiments, the metal layer may have a disk shape which includes a bottom surface adjacent to the first solder bump, a top surface adjacent to the second solder bump, and a side surface connecting the top surface to the bottom surface.

In other exemplary embodiments, at least one of the top and bottom surfaces may be even or stepped and the side surface may be vertical.

In still other exemplary embodiments, the first solder bump may comprise solder having a melting point identical to that of solder for the second solder bump.

In even other exemplary embodiments, one of the first and second solder bumps may comprise solder having a melting point less than that of solder for the other.

In yet other exemplary embodiments, the semiconductor device may further comprise an intermetallic compound layer interposed between the metal layer and at least one of the first and second solder bumps.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF PREFERRED EMBODIMENTS

Figure 1A:
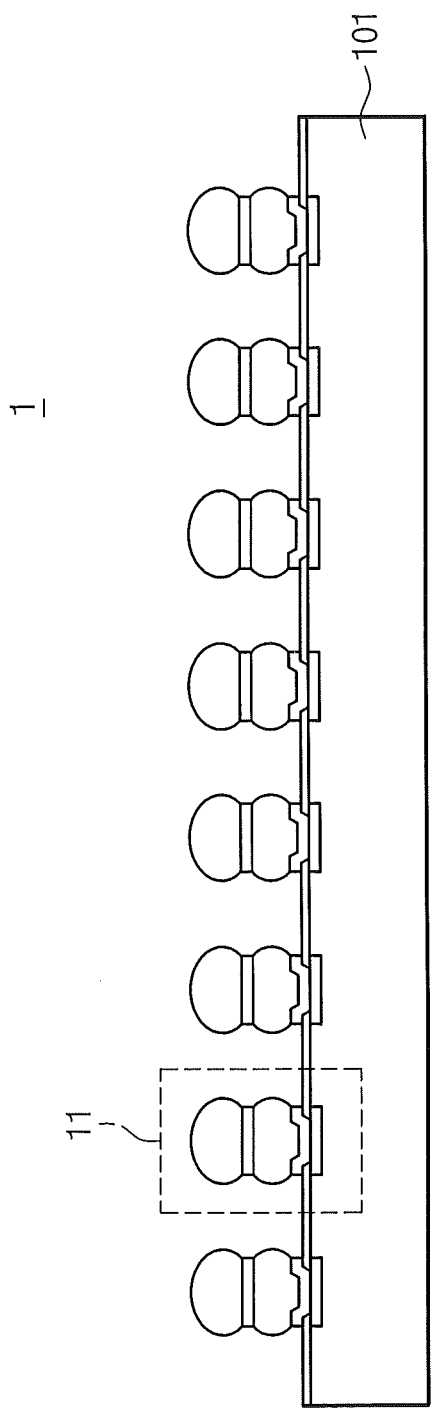
FIG. 1A is a cross-sectional view illustrating a semiconductor device according to some exemplary embodiments of the present inventive concepts.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of example embodiments of inventive concepts. Aspects of example embodiments of inventive concepts explained and illustrated herein include their complementary counterparts.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
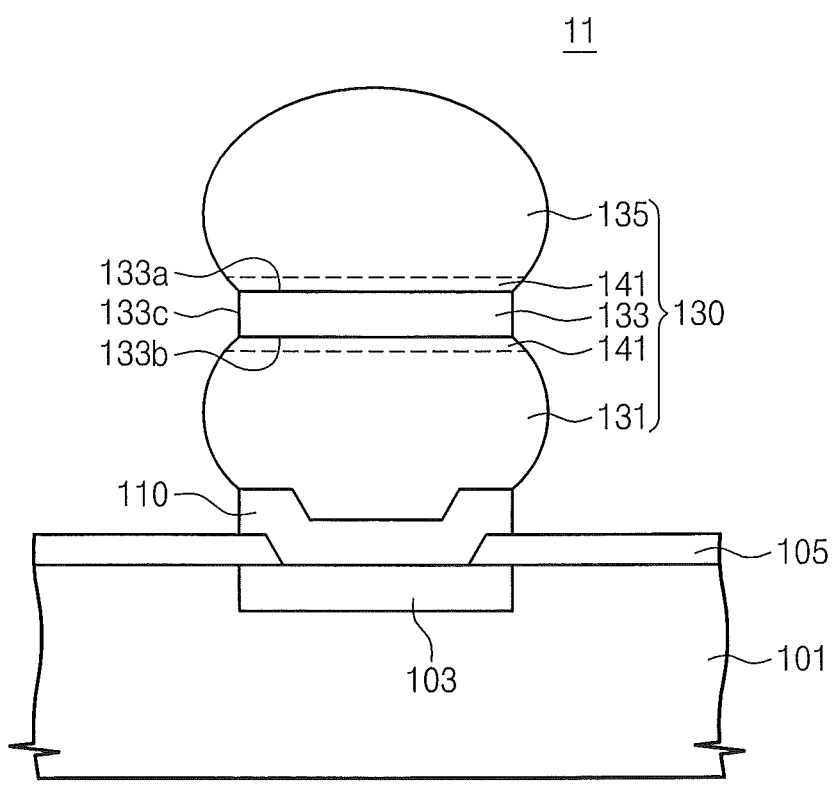
FIG. 1B is an enlarged cross-sectional view illustrating a portion of FIG. 1A.

FIG. 1A is a cross-sectional view illustrating a semiconductor device according to some exemplary embodiments of the present inventive concepts. FIG. 1B is an enlarged cross-sectional view illustrating a portion of FIG. 1A.

Referring to FIGS. 1A and 1B, a semiconductor device 1 may comprise a plurality of electrical interconnections 11 on a substrate 101 such as a silicon wafer. The substrate 101 may comprise an integrated circuit such as memory circuit, logic circuit or a combination thereof. The electrical interconnection 11 may comprise a bump stack 130 electrically connected to a chip pad 103 provided on the substrate 101. A passivation layer 105 may be provided on the substrate 101 to expose the chip pad 103. As one example, a plurality of electrical interconnections 11 may be arranged regularly on the substrate 101 such that an I/O integration may be improved. Alternatively, the electrical interconnections 11 may be concentrated along an edge or on a center of the substrate 101.

An under bump metal layer 110 may be disposed between the bump stack 130 and the chip pad 103. The under bump metal layer 110 may be single-layered or multi-layered structure. As one example, the under bump metal layer 110 may be a multi-layered structure including a first metal layer 111 as an adhesive layer, a second metal layer 112 as a barrier layer disposed on the first metal layer 111, and a third metal layer 113 as a wetting layer disposed on the second metal layer 112 as illustrated in FIG. 4E. The first to third metal layers 111 to 113 may comprise different metals. As one example, the first metal layer 111 may comprise Ti, the second metal layer 112 may comprise Cu, and the third metal layer 113 may comprise Ni. Alternatively, the under bump metal layer 110 may not comprise one of the first and second metal layers 111 and 112.

The bump stack 130 may be a multi-bead or multi-bump structure including at least two solder bumps 131 and 135 and at least one intermediate layer 133 interposed between the at least two solder bumps 131 and 135. The first and second solder bumps 131 and 135 may comprise the same solder (e.g., Sn, Sn—Ag) or different solders. The intermediate layer 133 may comprise metal (e.g., Ni, Ni—Sn). The first solder bump 131 may be spaced apart from the second solder bump 135 by the intermediate layer 133. An intermetallic compound layer 141 may be further provided between the intermediate layer 133 and the first solder bump 131. Another intermetallic compound layer 141 may be further provided between the intermediate layer 133 and the second solder bump 135. At least one of the first and second solder bumps 131 and 135 may have a bead or pillar shape. The intermediate layer 133 may have a flat or rugged disk shape. The bump stack 130 may have a dumbbell shape standing on the substrate 101. As one example, the bump stack 130 have a double bead structure or a double bump structure including the first solder bump 131 and the second solder bump 135 which are stacked and the intermediate layer 133 interposed between the first and second solder bumps 131 and 135. The intermediate layer 133 may be a disk-typed single layer including even top and bottom surfaces 133a and 133b and a vertical side surface 133c. Alternatively, the intermediate layer 133 may have a rugged top and bottom surfaces 133a and 133b and a vertical side surface 133c. The number and shape of the intermediate layer 133 and the solder bumps 131 and 135 may be modified diversely as described, for example with reference to FIGS. 5A to 5E.

The electrical interconnection 11 of the semiconductor device 1 may have the bump stack 130 such that a fine pitch, mechanical and/or thermal reliance and easy assembly process (e.g., packaging) may be acquired.

Figure 2A:
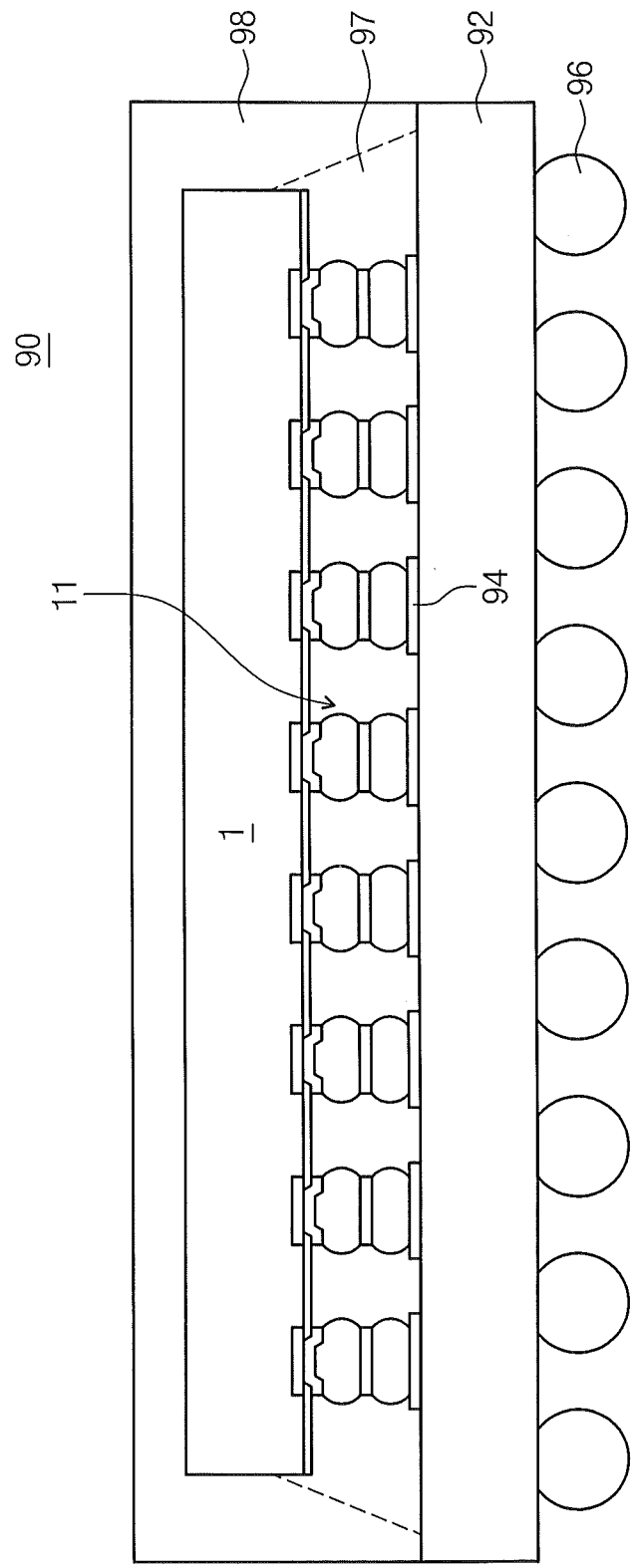
FIG. 2A is a cross-sectional view illustrating a semiconductor package including a semiconductor device according to some exemplary embodiments of the present inventive concepts.
Figure 2B:
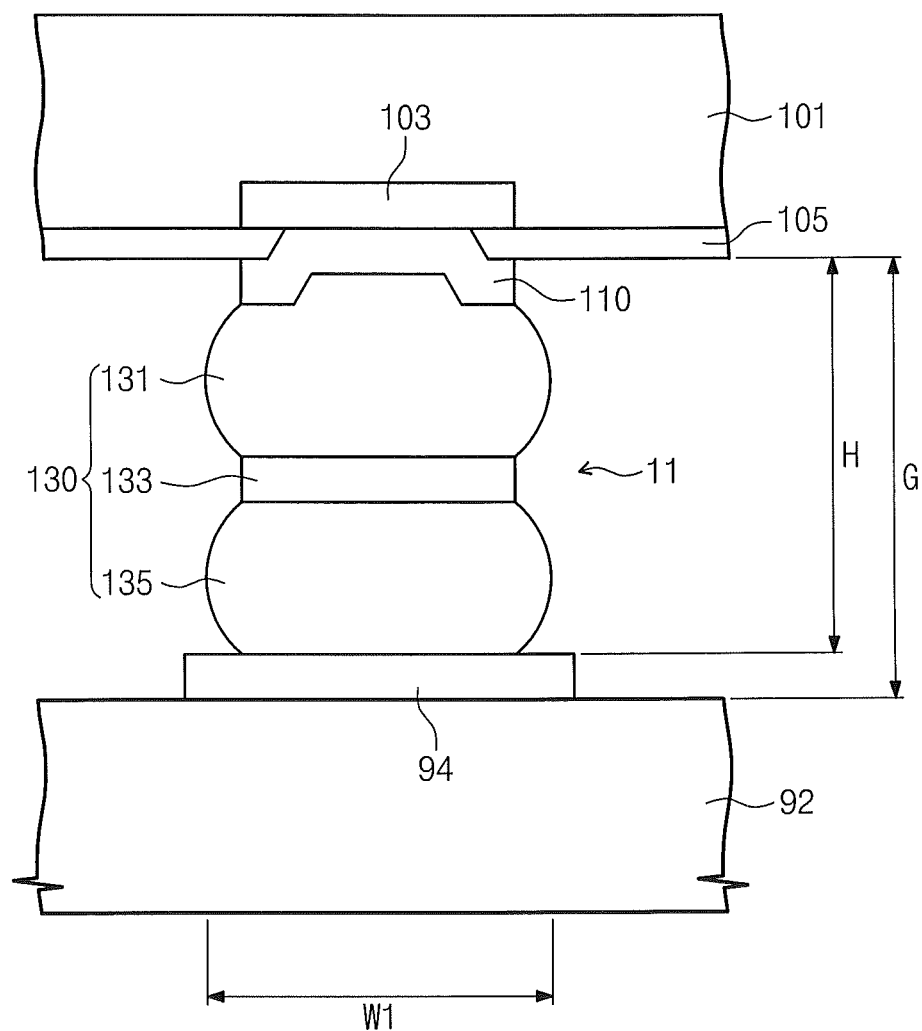
FIG. 2B is a cross-sectional view illustrating a portion of FIG. 2A.
Figure 2C:
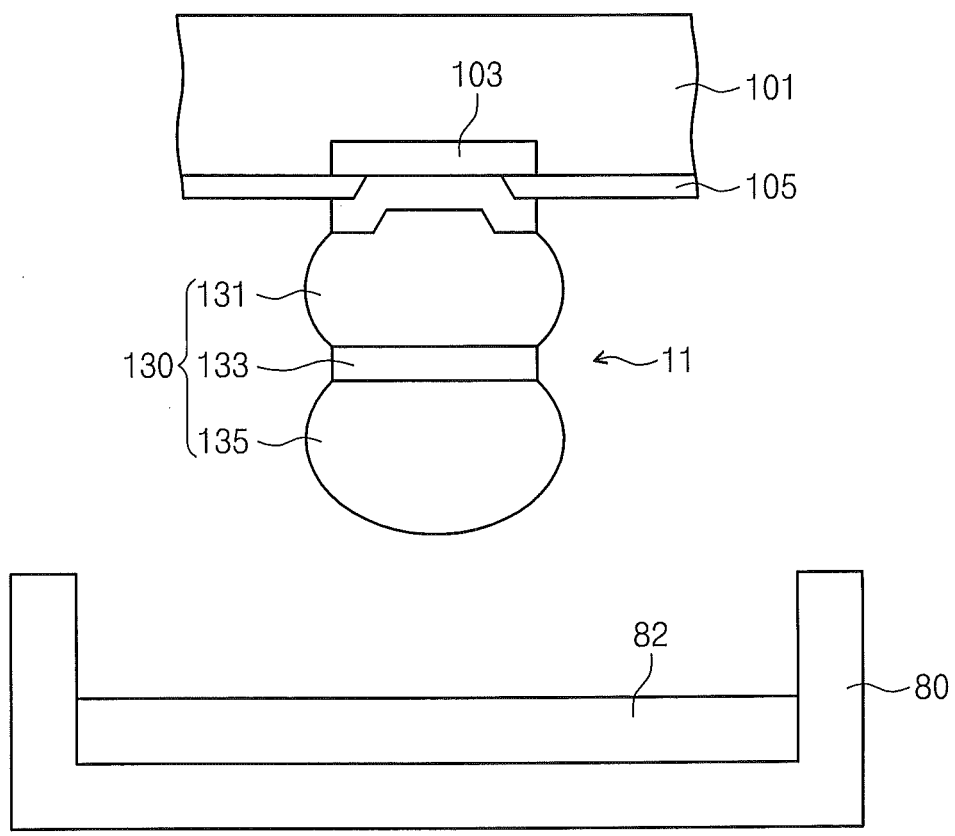
FIGS. 2C and 2D are cross-sectional views illustrating soldering of electrical interconnections.
Figure 2D:
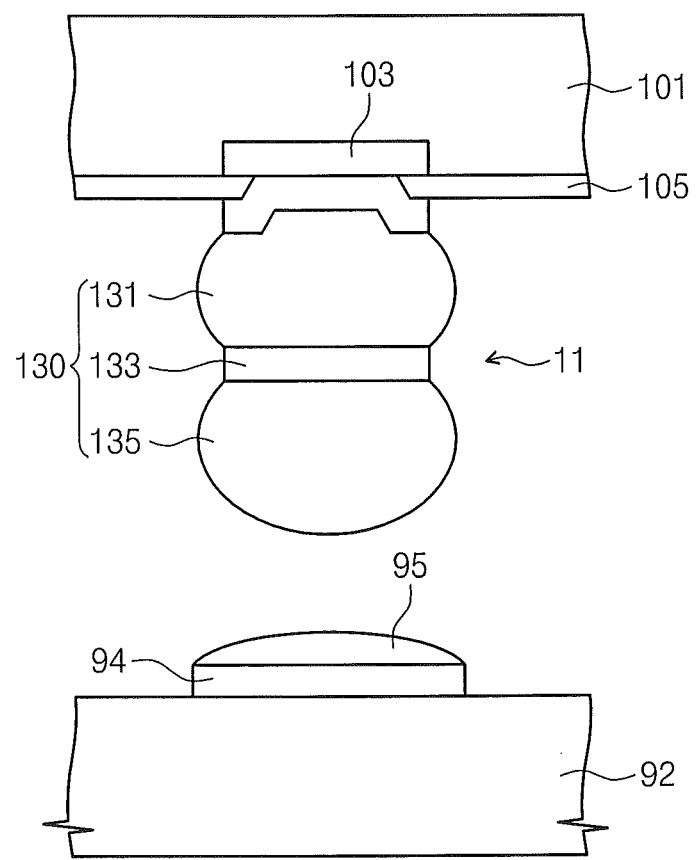

FIG. 2A is a cross-sectional view illustrating a semiconductor package including a semiconductor device according to some exemplary embodiments of the present inventive concepts. FIG. 2B is a cross-sectional view illustrating a portion of FIG. 2A. FIGS. 2C and 2D are cross-sectional views illustrating soldering of electrical interconnections.

Referring to FIGS. 2A and 2B, a semiconductor package 90 may be fabricated by mounting the semiconductor device 1 having the electrical interconnection 11 on a package substrate 92 and forming a molding layer 98 to mold the semiconductor device 1. The electrical interconnection 11 may be replaced with one of electrical interconnections 12, 13, 14, 15 and 16 which are described with reference to FIGS. 5A to 5E. The package substrate 92 may be a printed circuit board (PCB) including at least one external terminal 96 for an electrical interconnection to any electrical apparatus and a plurality of substrate pads 94 for electrical interconnections to the electrical interconnections 11. The mold layer 98 may cover the semiconductor device 1 and fill a gap between the semiconductor device 1 and the package substrate 92. Alternatively, an under-fill layer 97 may be further formed between the semiconductor device 1 and the package substrate 92.

The semiconductor device 1 may be mounted on the package substrate 92 in a manner of flip chip bonding. For example, the semiconductor device 1 may be mounted on the package, substrate 92 in a face down state that the electrical interconnections 11 face the package substrate 92 to be electrically connected to the substrate pads 94, which electrically connects the semiconductor device 1 to the package substrate 92. The semiconductor device 1 may be packaged through the flip chip bonding using the electrical interconnections 11 that are distributed on the substrate 101. Therefore, the semiconductor package 90 may have high thermal performance in a wide range of temperature because the electrical interconnections 11 may serve as heat paths. The semiconductor package 90 may have a plurality of semiconductor devices 1 which are mounted in the manner of flip chip bonding such that high packing density can be accomplished.

A soldering between the second solder bump 135 and the substrate pad 94 may be realized by soaking the bump stack 130 in a container 80 in which flux 82 is stored as illustrated in FIG. 2C. The good soldering between the second solder bump 135 and the substrate pad 94 may be available because the second solder bump 135 may keep in a clean state by the flux 82. Alternatively, the second solder bump 135 may be adhered to a solder 95 provided on the substrate pad 94 as illustrated in FIG. 2D.

A needed gap G between the substrate 101 and the package substrate 92 may be assured because a height H of the bump stack 130 may be adjusted arbitrarily. As appreciated by the present inventors, if the gap G is much less, the mold layer 98 and/or the under-fill layer 97 may not be completely formed. This may lead to a poor interconnection between the electrical interconnection 11 and the substrate pad 94, which may deteriorate mechanical and/or electrical characteristics. Accordingly, as appreciated by the present inventors, it may be needed to assure the gap G with reasonable size for a good formation of the mold layer 98 and/or the under-fill layer 97. For example, a size of the gap G may be about 60 μm or more to provide sufficient filler (e.g., epoxy molding compound) into the gap G. The height H of the bump stack 130 may be 60 μm to secure the size of the gap G. As one example, if each thickness of the first and second solder bumps 131 and 135 may be about 5 to 50 μm and a thickness of the intermediate layer 133 may be about 1 to 20 μm, the height H of the bump stack 130 may be about 11 to 120 μm. That is, an appropriate control of thicknesses of the solder bumps 131 and 134 and the intermediate layer 133 may assure the needed size of the gap G. In the specification, the height H of the bump stack 130 may be defined as a length protruded from the substrate 101. For example, the height H of the bump stack 130 may be given a vertical length from a top surface of the substrate 101 or the passivation layer 105 to a top surface of the second solder bump 135, or a total thickness of the first and second solder bumps 131 and 135 and the intermediate layer 133.

Figure 3A:
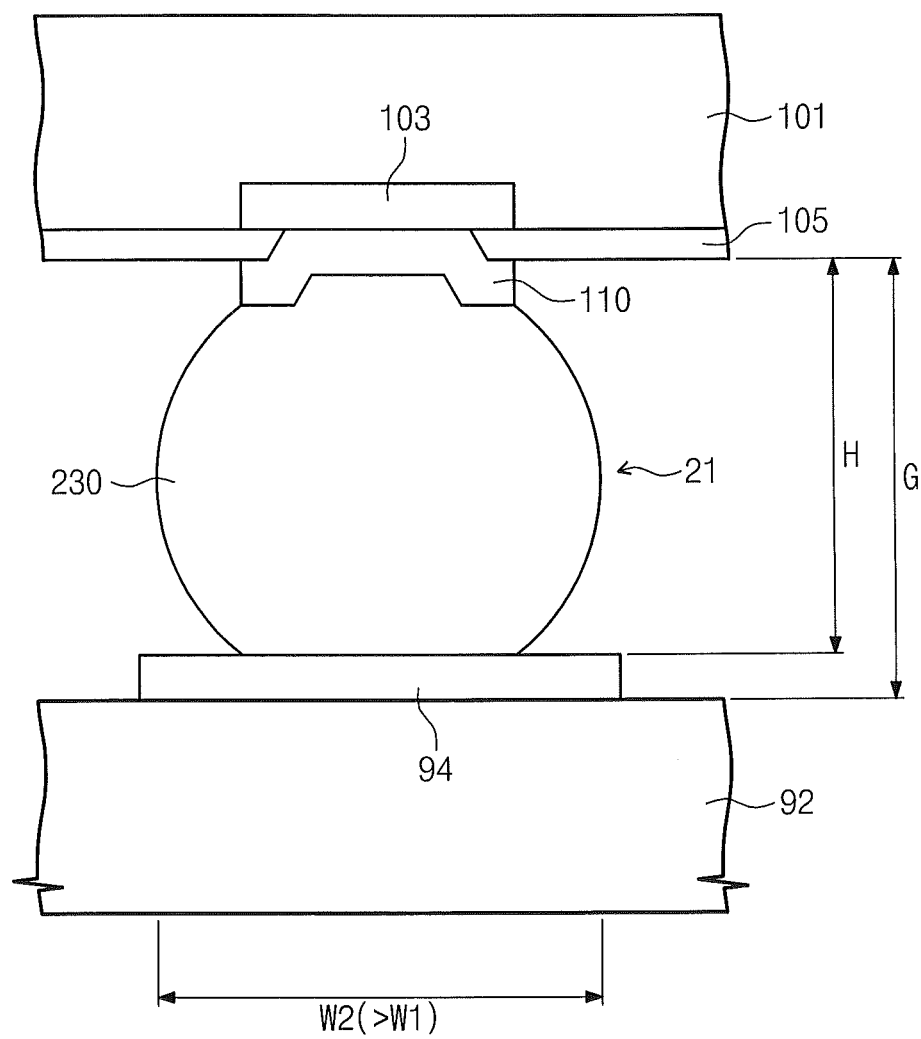
FIG. 3A is a cross-sectional view illustrating a general electrical interconnection between a solder bump structure and a package substrate.
Figure 3B:
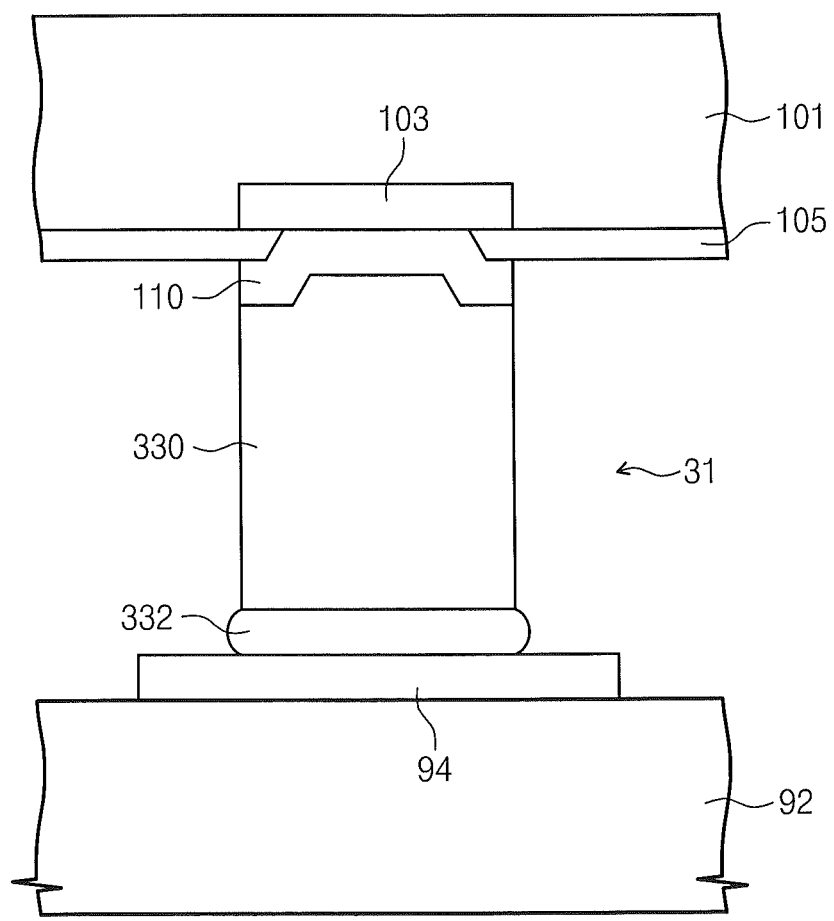
FIG. 3B is a cross-sectional view illustrating a general electrical interconnection between a pillar bump structure and a package substrate.

FIG. 3A is a cross-sectional view illustrating a general electrical interconnection between a solder bump structure and a package substrate. FIG. 3B is a cross-sectional view illustrating a general electrical interconnection between a pillar bump structure and a package substrate.

Referring to FIGS. 3A and 2B, the bump stack 130 having a double bump structure may have a width less than that of a single bump structure having a height same or similar to the height H of the bump stack 130. For example, there may be a general electrical interconnection 21 that has a single solder bump 230 and a height H same or similar to the height H of the bump stack 130 as illustrate in FIG. 3A. The electrical interconnection 21 may be connected to the substrate pad 94 to secure a gap G as like the embodiments of the present inventive concept. In this case, the single solder bump 230 may have a volume greater than each of the first and second solder bumps 131 and 135. Therefore, the single solder bump 230 may have a width W2 greater than that W1 of the bump stack 130. The wide width W2 of the single solder bump 230 may induce a wide pitch compared to the bump stack 130. A fine pitch (e.g., 100 μm or less) can be accomplished because the bump stack 130 may be formed to have a micro-bump structure.

Referring to FIGS. 3B and 2B, the bump stack 130 may have good mechanical and/or electrical characteristics compared to a bump pillar structure due to the intermediate layer 133 interposed between the first and second solder bumps 131 and 135. For example, there may be a general electrical interconnection 31 that has a bump pillar 330 or the bump pillar 330 and a solder layer 332 thereon as illustrated in FIG. 3B. Mechanical and/or thermal stresses may be applied to the electrical interconnection 31 when the substrate 101 is mounted on the package substrate 92 in the manner of flip chip bonding and/or the semiconductor package is used. Therefore, the bump pillar 330 and/or solder layer 332 may be deformed or fractured. According to some embodiments, the intermediate layer 133 may prevent at least one of the first and second solder bumps 131 and 135 from deforming due to the mechanical and/or thermal stresses, and/or may relieve the stress.

FIGS. 4A to 4F are cross-sectional views illustrating a method for fabricating a semiconductor device according to some exemplary embodiments of the present inventive concepts.

Figure 4A:
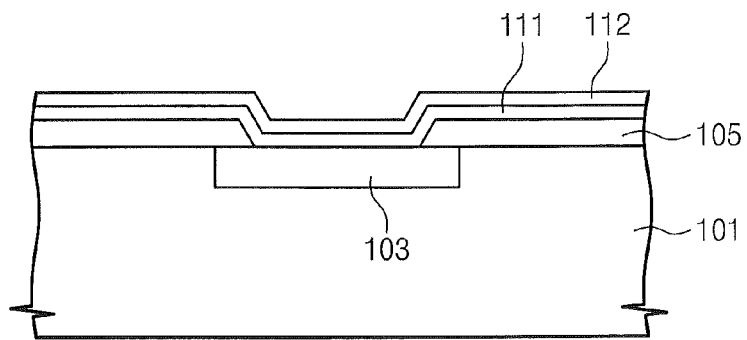
FIGS. 4A to 4F are cross-sectional views illustrating a method for fabricating a semiconductor device according to some exemplary embodiments of the present inventive concepts.

Referring to FIG. 4A, a first metal layer 111 and a second metal layer 112 may be successively formed on a substrate 101 having a chip pad 103 formed thereon. The substrate 101 may be a silicon wafer. The chip pad 103 may be formed by depositing or electroplating metal (e.g., Cu, Al) on the substrate 101. A passivation layer 105 may be further formed to expose the chip pad 103. The passivation layer 105 may comprise silicon oxide, silicon nitride, or polymer such as polyimide. The first metal layer 111 may be a metallic glue layer having a good adhesion to the chip pad 103 or the passivation layer 105. The first metal layer 111 may be formed by depositing (e.g., sputtering) Ti, Ti—W, Cr, Al, or any combinations thereof. The second metal layer 112 may be a metallic barrier layer which can prevent diffusion of solder (e.g., Sn—Ag) or some metal (e.g., Cu). The second metal layer 112 may be formed by depositing (e.g., sputtering) Cu, Cr—Cu, Ni, Ni—V or any combinations thereof. Alternatively, a single layer may be formed on the substrate 101 which can serve as adhesive and barrier by plating (e.g., electroless plating) Ni.

Figure 4B:
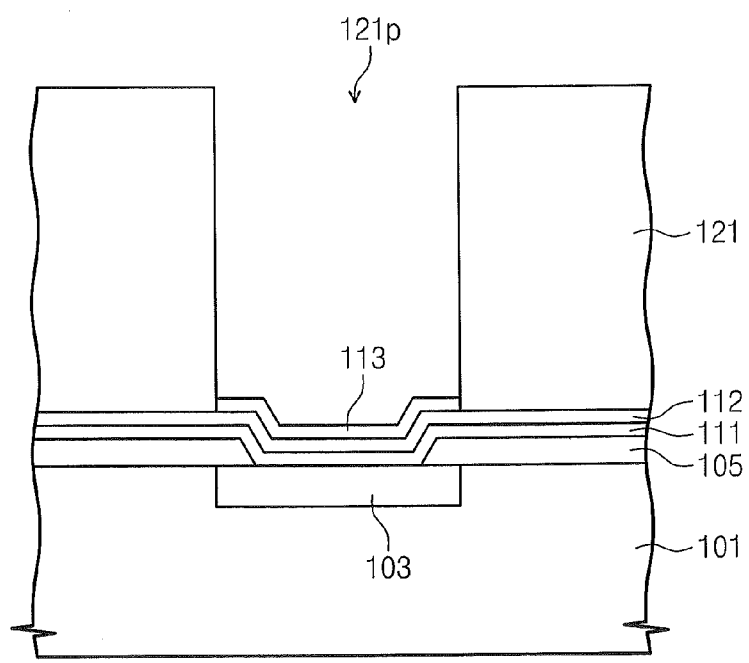

Referring to FIG. 4B, a third metal layer 113 may be formed on the second metal layer 112. For example, a mask layer 121 may be formed on the second metal layer 112 and the third metal layer 113 may be formed. The mask layer 121 may be formed by coating and patterning photoresist to have an opening 121p that opens a region over the chip pad 103.

The third metal layer 113 may be formed by plating (e.g., electroplating) Ni, Cu, Au or any combinations thereof. The third metal layer 113 may serve as a wetting layer to solder.

Figure 4C:
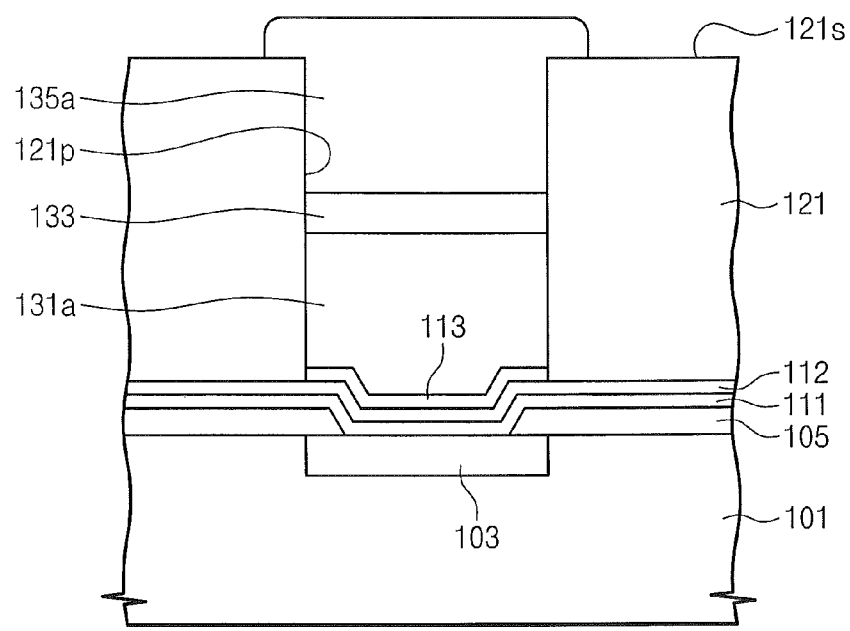

Referring to FIG. 4C, a first solder bump layer 131a, an intermediate layer 133 and a second solder bump layer 135a may be formed in the opening 121p. According to some embodiments, the first and second solder bump layers 131a and 135a may be formed by plating (e.g., electro plating) the same solder. The first and second solder bump layers 131a and 135a may be formed by electroplating Sn, In, Sn—In, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, Sn—Ag—Ce or any combinations thereof. The intermediate layer 133 may be formed by plating or depositing metal having a melting point greater than those of the first solder bump layer 131a and/or the second solder bump layer 135a. Alternatively, the intermediate layer 133 may be formed by plating or depositing noble metal compared to the first solder bump layer 131a and/or the second solder bump layer 135a. For example, the first and second solder bump layers 131a and 135a may comprise Sn—Ag or Sn—Bi, and the intermediate layer 133 may comprise Ni or Ni—Sn.

The third metal layer 113 has a recessed shape. The first solder bump layer 131a may have a flat top surface because the first solder bump layer 131a may have a thickness greater than that of the third metal layer 113. Therefore, the intermediate layer 133 may have a flat disk shape. A shape of the second solder bump layer 135a may be changed according to a height of the mask layer 121 or a volume of the second solder bump layer 135a. For example, the second solder bump layer 135a may have a mushroom shape when the second solder bump layer 135a may be formed to have a top surface higher than a stop surface 121s of the mask layer 121.

Figure 4D:
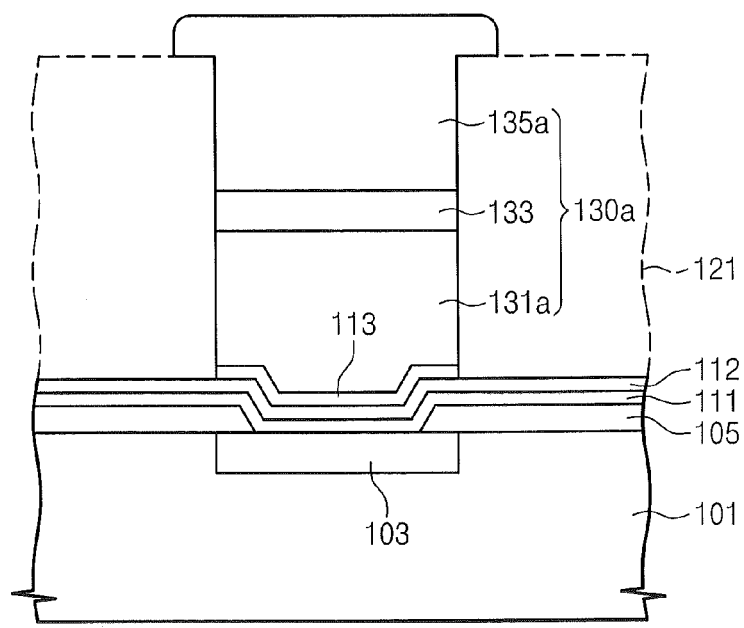
Figure 4E:
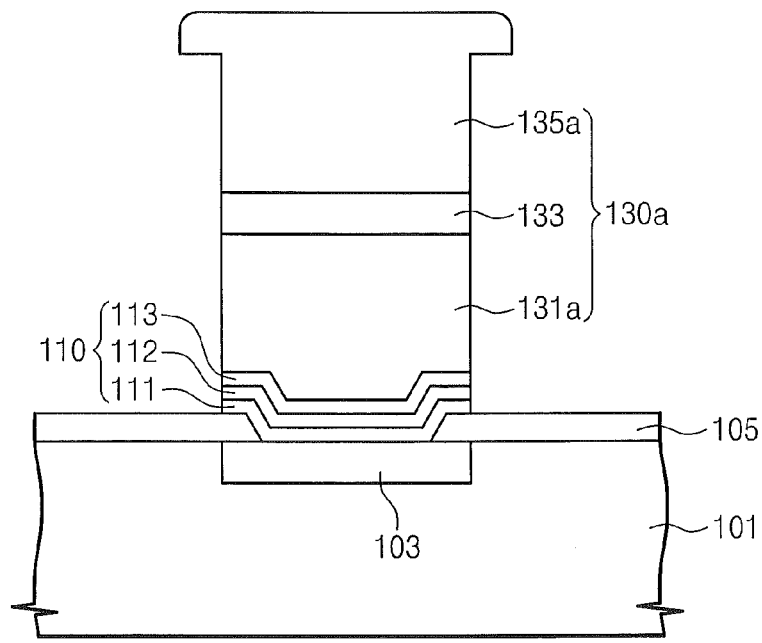

Referring to FIG. 4D, the mask, layer 121 may be removed by an ashing process. After the removal of the mask layer 121, there may be formed on the substrate 101a solder stack 130a including the first solder bump layer 131a, the intermediate layer 133 and the second solder bump layer 135a, which are stacked and have sidewalls that are vertically aligned with sidewalls of the chip pad 103. The solder stack 130a may not cover a portion of the second metal layer 112 so that the portion of the second metal layer 112 may be exposed.

Referring to FIG. 4E, the portion of the second metal layer 112 which is not covered by the solder stack 130a may be selectively removed and a portion of the first metal 111 directly under the portion of the second metal layer 112 may be selectively removed. The patterned first and second metal layers 111 and 112 and the third metal layer 113 may constitute an under bump metal layer 110 between the solder stack 130a and the chip pad 103. A dry or wet etching process may be used to selectively remove the first and second metal layers 111 and 112.

Figure 4F:
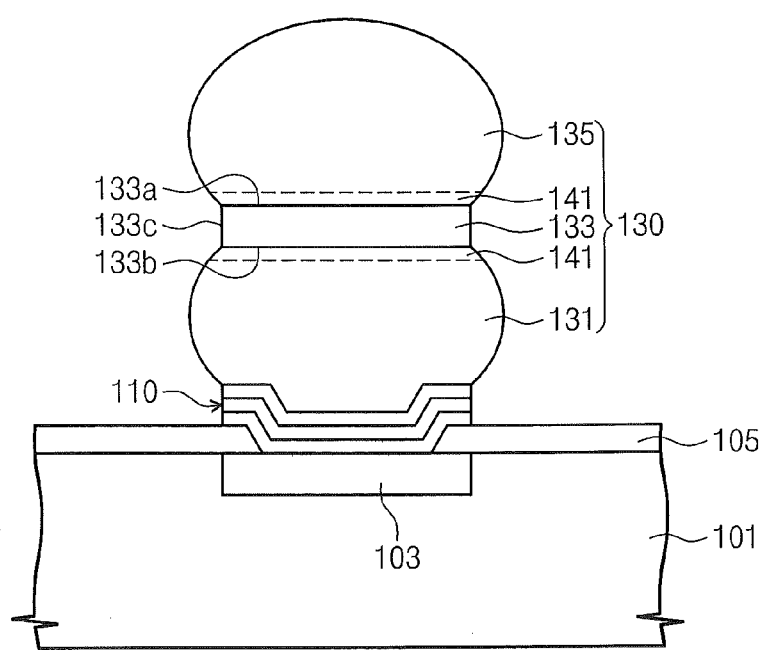

Referring to FIG. 4F, the solder stack 130a may be reflowed to form a bump stack 130 having a vertical double bump structure. For example, if the solder stack 130a is reflowed under the temperature greater than the melting point (e.g., 250° C. or less) of the first solder layer 131a and the second solder layer 135a, the first solder layer 131a and the second solder layer 135a can be changed into a liquid phase. Due to the surface tension of liquid solder, each of the first and the second solder layers 131a and 135a may be formed to have a bead shape. The first and second solder bumps 131 and 135 may be formed simultaneously. Because the intermediate layer 133 may comprise metal having high melting point or noble metal than the first and second solder layers 131a and 135a, the intermediate layer 133 may remain the flat disk shape having even top and bottom surfaces 133a and 133b and the vertical side surface 133c though the reflow process is performed. Alternatively, the intermediate layer 133 may have irregular top and bottom surfaces 133a and 133b and the vertical side surface 133c. The reflow process may react the intermediate layer 133 with the solder bumps 131 and 135 such that intermetallic compound layers 141 may be formed between the intermediate layer 133 and the first solder bump 131 and between the intermediate layer 133 and the second solder bump 135. According to processes described above, there may be formed a semiconductor device 1 with an electrical interconnection 11 having the bump stack 130 as illustrated in FIG. 1A. Alternatively, the first and second solder bumps 131 and 135 may have a shape similar to a pillar (with the intermediate layer 133 therebetween) depending on the reflow temperature.

In some exemplary embodiments, the intermediate layer 133 may prevent solder from diffusing from the first solder bump 131 to the second solder bump 135 or vice versa. Moreover, the intermediate layer 133 may prevent the first and/or second solder bumps 131 and 135 from deforming due to the mechanical and/or thermal stresses and may relieve the stresses.

FIGS. 5A to 5E are cross-sectional views illustrating different embodiments of FIG. 4F.

Figure 5A:
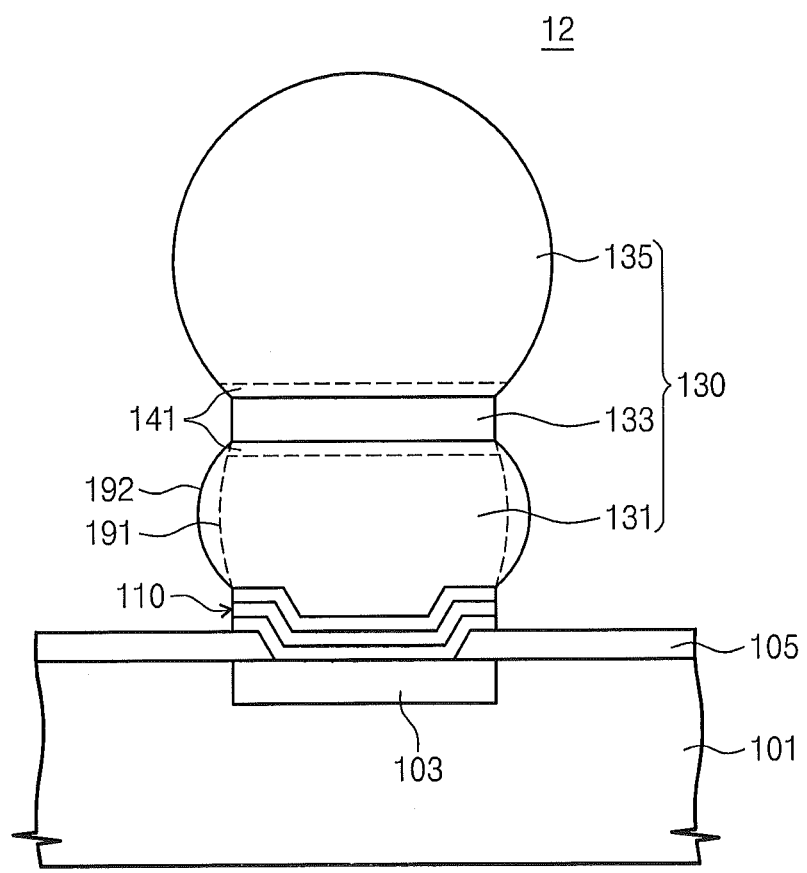
FIGS. 5A to 5E are cross-sectional views illustrating other embodiments of FIG. 4F.

Referring to FIG. 5A, a second electrical interconnection 12 having a hybrid vertical bump stack 130 may be formed by vertical stacking a bead-shaped second solder bump 135 on a pillar-shaped first solder bump 131. For example, if the first solder bump 131 comprises a high melting point solder (e.g., Sn—Ag) and the second solder bump 135 comprises a lower melting point solder (e.g., Sn—Bi), the reflow process may make the second solder bump 135 a bead shaped and the first solder bump 131a cylindrical pillar or entasis pillar shape.

Figure 5B:
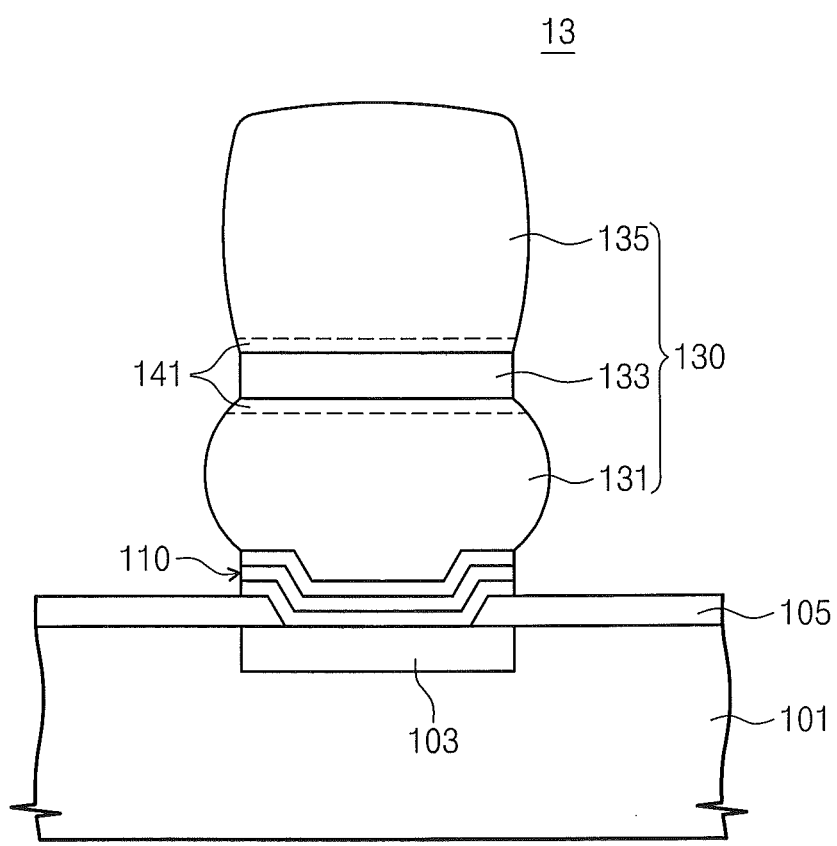

Referring to FIG. 5B, a third electrical interconnection 13 having a hybrid bump stack 130 may be formed by vertically stacking a pillar-shaped second solder bump 135 on a bead-shaped first solder bump 131. For example, if the first solder bump 131 comprises a lower melting point solder (e.g., Sn—Bi) and the second solder bump 135 comprises a higher melting point solder (e.g., Sn—Ag), the reflow process may make the first solder bump 131 bead-shaped and the second solder bump 135 cylindrical pillar or entasis pillar shaped.

Figure 5C:
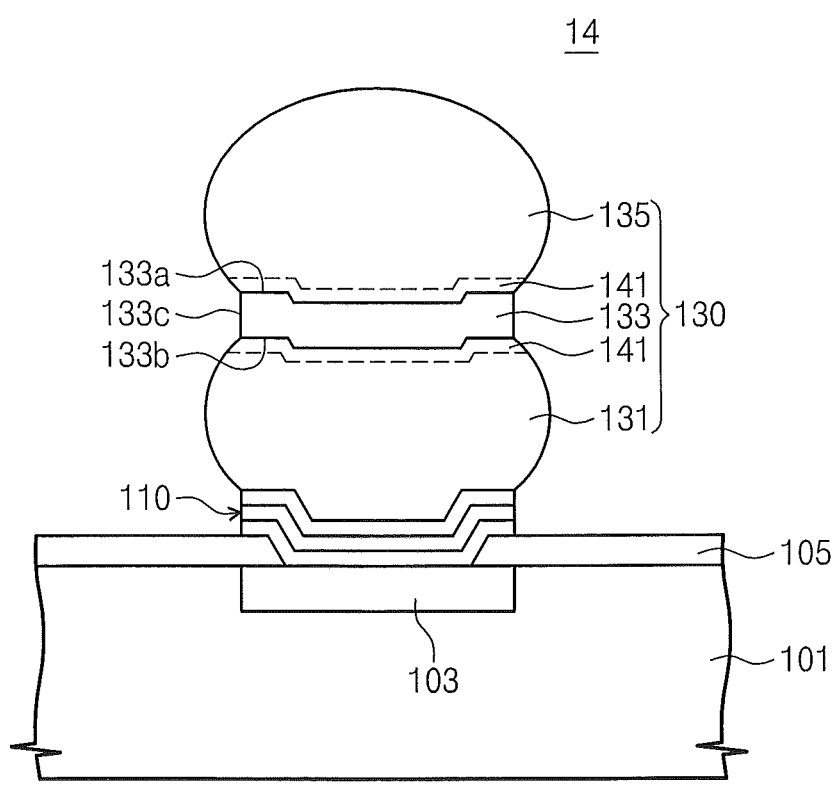

Referring to FIG. 5C, a fourth electrical interconnection 14 may be formed to have a vertically stacked double bump structure. The fourth electrical interconnection 14 may comprise a disk-shaped intermediate layer 133 that includes stepped top and bottom surfaces 133a and 133b and a vertical side surface 133c. The under bump metal layer 110 may be formed to have a stair shape such that the first solder bump 131 may be formed to have a stepped top surface. Therefore, the intermediate layer 133 may be formed to have the stepped top and bottom surfaces 133a and 133b. Alternatively, the side surface 133c of the intermediate layer 133 may be vertical and one of the top and bottom surfaces 133a and 133b of the intermediate layer 133 may be flat and the other may be stepped. In some embodiments, the top surface 133a of the intermediate layer 133 may be flat and the bottom surface 133b of the intermediate layer 133 may be stepped.

Figure 5D:
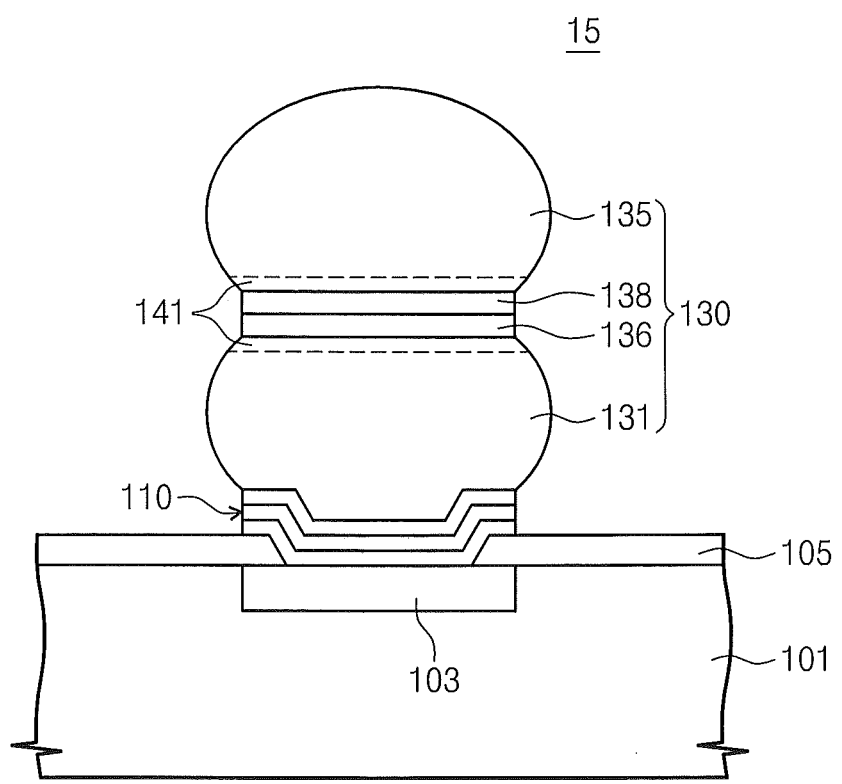

Referring to FIG. 5D, a fifth electrical interconnection 15 may be formed to have a multi-layered intermediate layer. For example, the multi-layered intermediate layer may comprise a lower intermediate layer 136 and an upper intermediate layer 138 which are stacked vertically. One of the upper and lower intermediate layers 136 and 138 may be formed by Ni and the other may be formed by Ni—Sn.

Figure 5E:
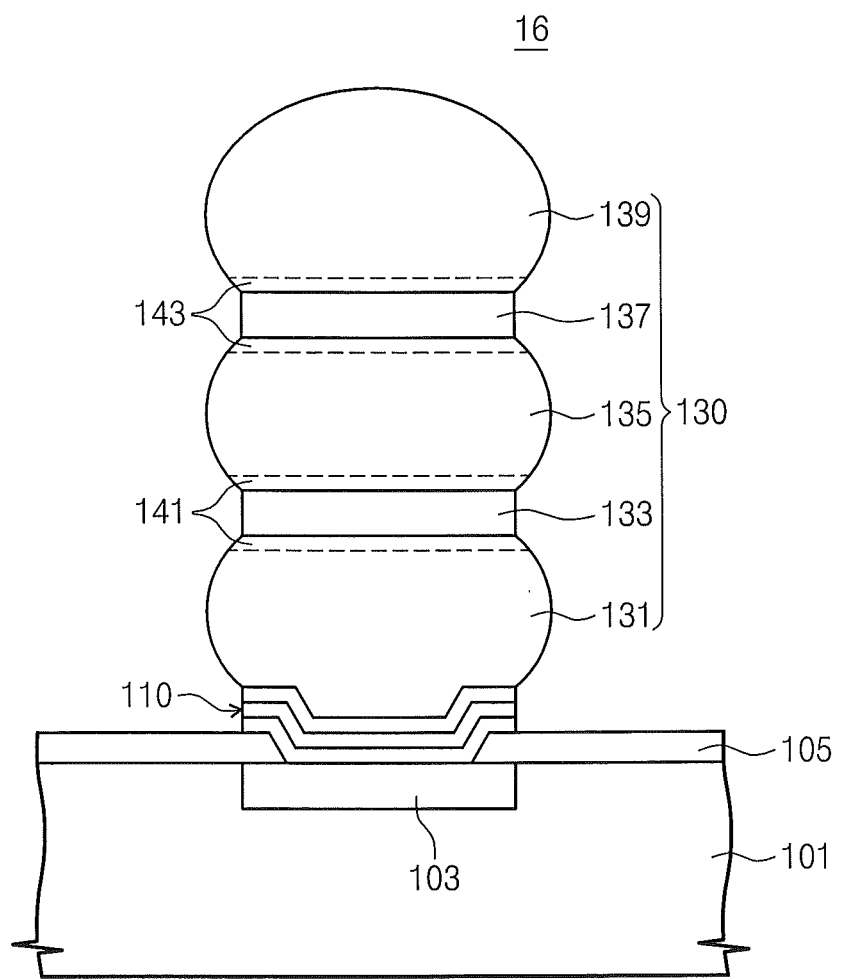

Referring to FIG. 5E, a sixth electrical interconnection 16 may be formed to have a triple bump structure. The sixth electrical interconnection 16 may further comprise a third solder bump 139 on the second solder bump 135. The intermediate layer 133 may be formed between the first and second bumps 131 and 135 and a second intermediate layer 137 may be further formed between the second and third solder bumps 135 and 139. The first to third solder bumps 131, 135 and 139 may be formed by electroplating and reflowing the same or different solder. The second intermediate layer 137 may be formed by electroplating or depositing metal identical or similar to that of the intermediate layer 133. For example, the second intermediate layer 137 may comprise metal having a melting point greater than that of at least one of the first to third solder bumps 131, 135 and 139. Alternatively, the second intermediate layer 137 may comprise noble metal compared to at least of the first to third solder bumps 131, 135 and 139. At least one of the first to third solder bumps 131, 135 and 139 may be formed to have a bead or pillar shape. At least one of the intermediate layer 133 and the second intermediate layer 137 may have a flat or stepped disk shape.

Figure 6A:
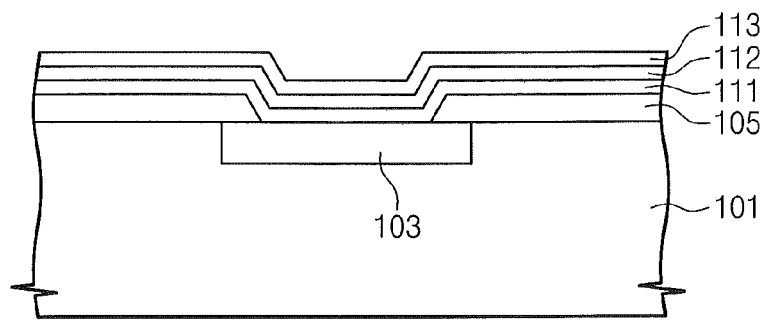
FIGS. 6A to 6C are cross-sectional views illustrating a method for fabricating a semiconductor device according to some exemplary embodiments of the present inventive concepts.
Figure 6B:
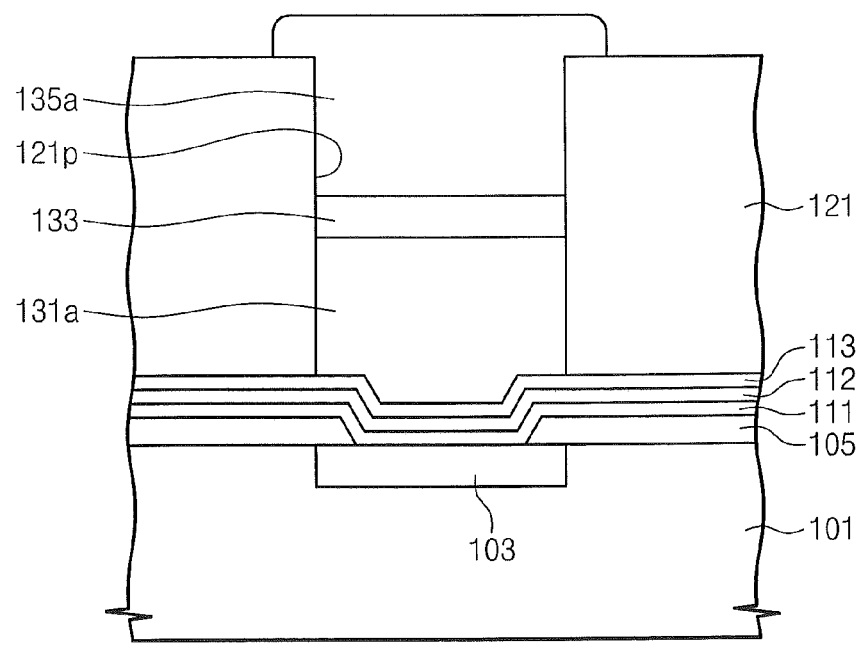
Figure 6C:
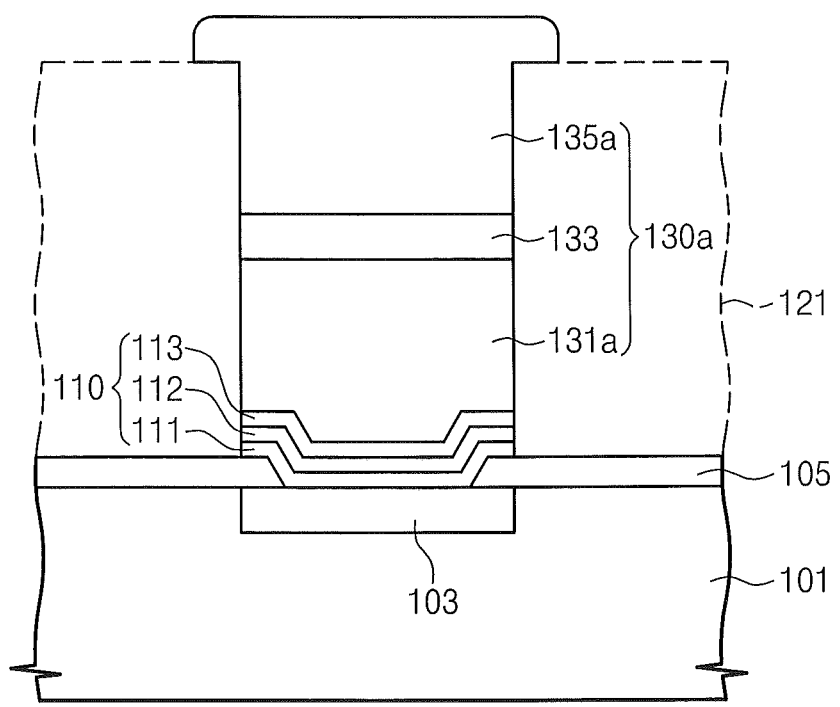

FIGS. 6A to 6C are cross-sectional views illustrating a method for fabricating a semiconductor device according to some exemplary embodiments of the present inventive concepts.

Referring to FIG. 6A, a first metal layer 111, a second metal layer 112 and a third metal layer 113 may be successively formed on a substrate 101. For example, the first to third metal layers 111 to 113 may be formed by a deposition process (e.g., sputtering), a plating process (e.g., electroplating), or a combination thereof.

Referring to FIG. 6B, a mask layer 121 may be formed on the third metal layer 113 by coating and patterning photoresist. The mask layer 121 may have an opening 121p having sidewalls that are vertically aligned with sidewalls of a chip pad 103. Thereafter, a first solder layer 131a, an intermediate layer 133 and a second solder layer 135a may be formed in the opening 121p. The first and second solder layers 131a and 135a may be formed by plating (e.g., electroplating) the same or different solder. The intermediate layer 133 may be formed by plating (e.g., electroplating) metal having a melting point greater than that of at least one of the first and second solder layers 131a and 135a. Alternatively, the intermediate layer 133 may be formed by plating (e.g., electroplating) noble metal compared to at least one of the first and second solder layers 131a and 135a.

Referring to FIG. 6C, the mask layer 121 may be removed by an ashing process. The first to third metal layers 111 to 113 which are not overlapped with a solder stack 130a may be selectively removed by an etching process. According to exemplary embodiments, an under bump metal layer 110 may be formed between the solder stack 130a and the chip pad 103 due to the selective removal of the first to third metal layers 111 to 113. The solder stack 130a may be reflowed to form an electrical interconnection 11 having a double bump structure as illustrated in FIG. 4F. Therefore, the semiconductor device 1 having the electrical interconnection 11 may be formed as illustrated in FIG. 1A.

Figure 7A:
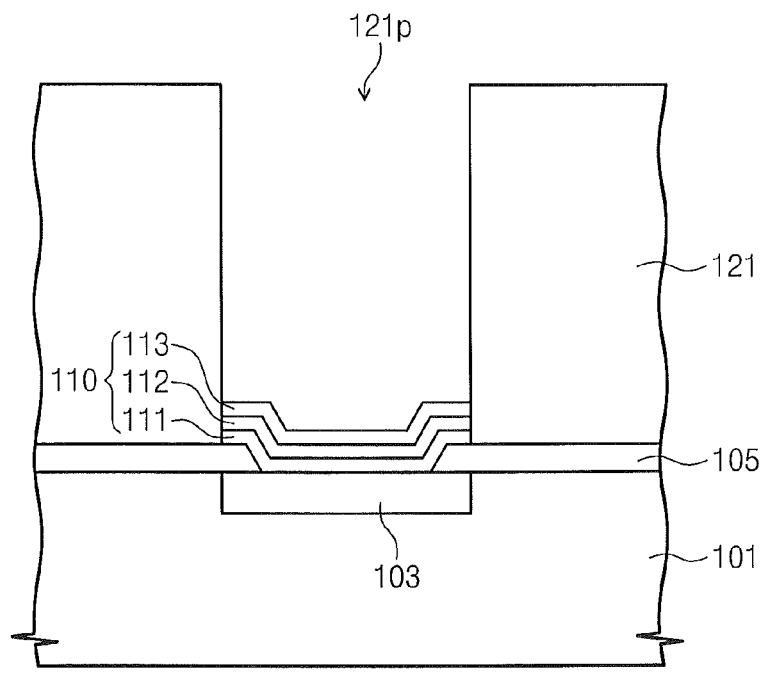
FIGS. 7A to 7C are cross-sectional views illustrating a method for fabricating a semiconductor device according to some exemplary embodiments of the present inventive concepts.
Figure 7B:
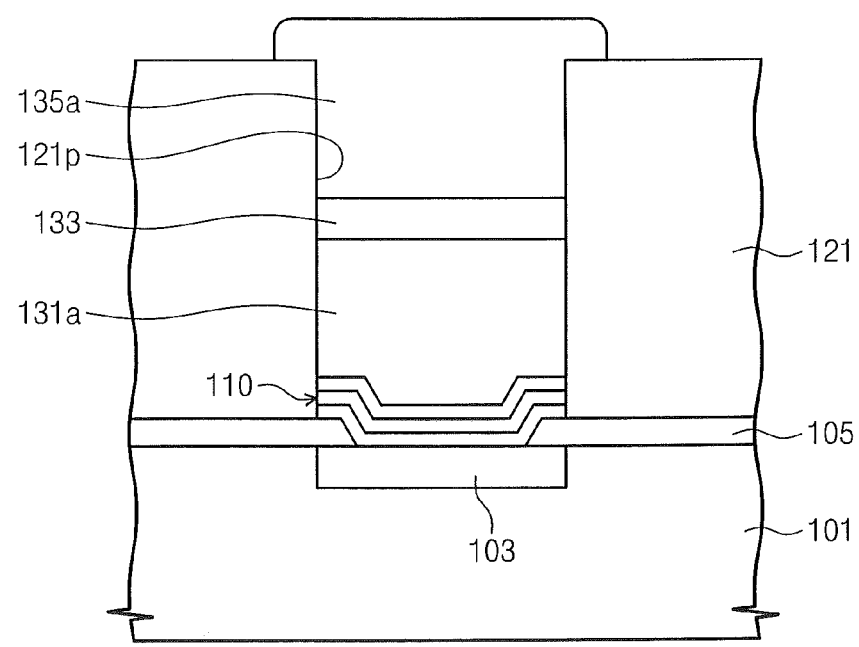
Figure 7C:
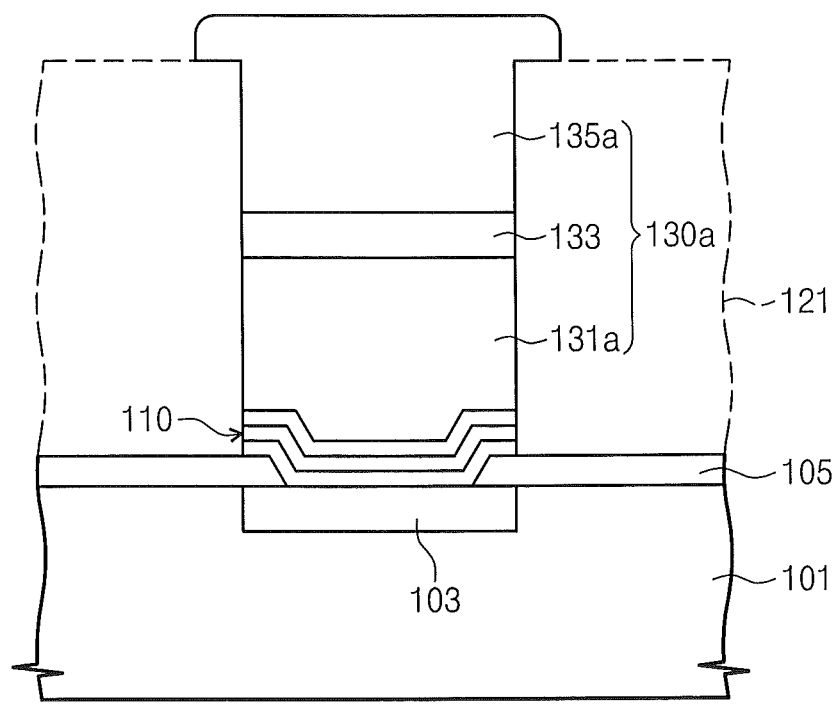

FIGS. 7A to 7C are cross-sectional views illustrating a method for fabricating a semiconductor device according to some exemplary embodiments of the present inventive concepts.

Referring to FIG. 7A, a mask layer 121 may be formed by coating and patterning photoresist on a substrate 101. The mask layer 121 may comprise an opening 121p that exposes a chip pad 103 formed on the substrate 101. Thereafter, a first metal layer 111, a second metal layer 112 and a third metal layer 113 may be formed in the opening 121p to form an under bump metal layer 110. According to exemplary embodiments, the first to third metal layers 111 to 113 may be formed by a plating process (e.g., electroplating process).

Referring to FIG. 7B, a first solder layer 131a, an intermediate layer 133 and a second solder layer 135a may be formed in the opening 121p. For example, the first and second solder layers 131a and 135a may be formed by plating (e.g., electroplating) solder and the intermediate layer 133 may be formed by plating (e.g., electroplating) noble metal having a melting point greater than that of at least one of the first and second solder layers 131a and 135a.

Referring to FIG. 7C, the mask layer 121 may be removed by an ashing process. Therefore, a solder stack 130a may be formed to have the first solder layer 131a, the intermediate layer 133 and the second solder layer 135a which are stacked on the under bump metal layer 110. The solder stack 130a may be reflowed to form an electrical interconnection 11 having a double bump structure as illustrated in FIG. 4F. Therefore, the semiconductor device 1 having the electrical interconnection 11 may be formed as illustrated in FIG. 1A.

Figure 8A:
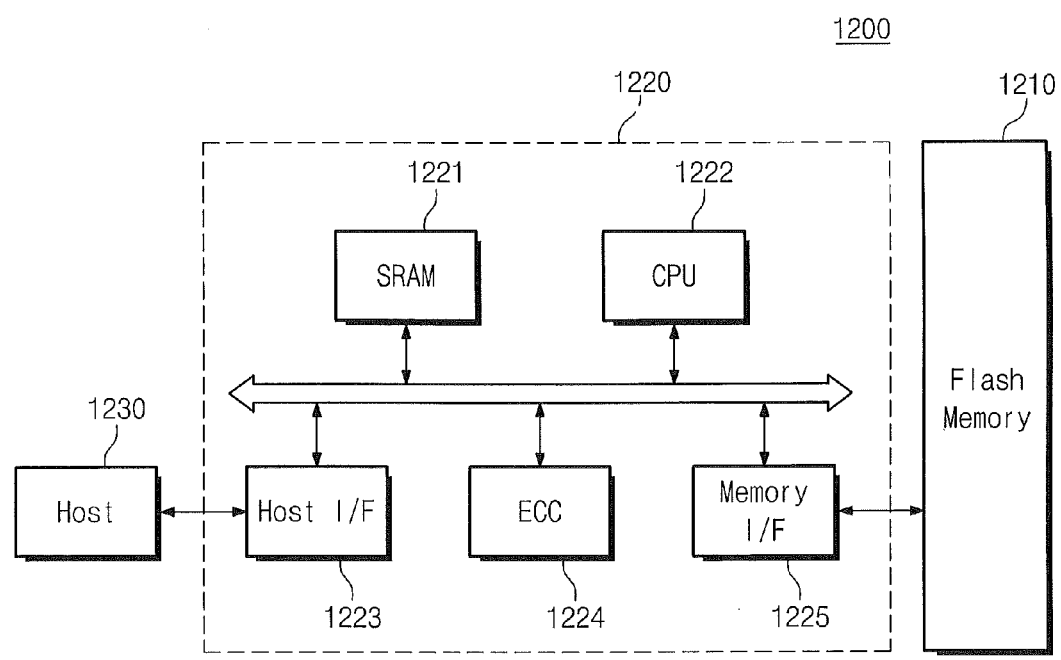
FIG. 8A is a schematic block diagram illustrating an example of memory cards including at least one semiconductor apparatus according to exemplary embodiments of the present inventive concepts.

FIG. 8A is a schematic block diagram illustrating an example of memory cards including at least one semiconductor apparatus according to exemplary embodiments of the present inventive concepts.

Referring to FIG. 8A, a memory card 1200 may include a memory controller 1220 generally controlling data exchange between a host 1230 and the flash memory device 1210. An SRAM 1221 is used as a work memory of a processing unit 1222. A host interface 1223 has a data exchange protocol of the host 1230 connected to the memory card 1200. An error correction coding block 1224 detects and corrects errors contained in data read from the flash memory device 1210. A memory interface 1225 interfaces the flash memory device 1210 according to the example embodiments. The central processing unit 1222 generally controls data exchange with the memory controller 1220. At least one of the flash memory 1210, SRAM 1221 and the central processing unit 1222 may comprise at least one of the semiconductor device 1 of FIG. 1A and the semiconductor package 90 of FIG. 2A according to the exemplary embodiments.

Figure 8B:
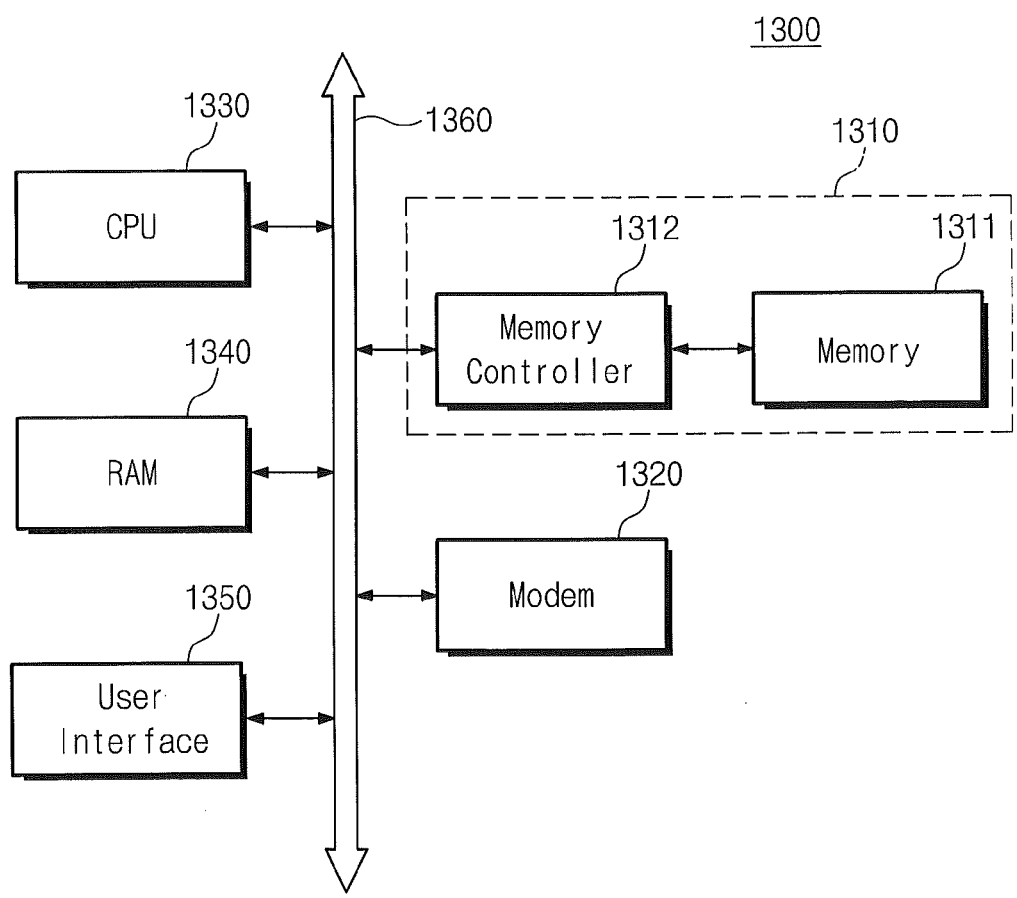
FIG. 8B is a schematic block diagram illustrating an example of information process system including at least one semiconductor apparatus according to exemplary embodiments of the present inventive concepts.

FIG. 8B is a schematic block diagram illustrating an example of information process system including at least one semiconductor apparatus according to exemplary embodiments of the present inventive concepts.

Referring to FIG. 8B, an information processing system 1300 may include a memory system 1310 having at least one of the semiconductor device 1 of FIG. 1A and the semiconductor package 90 of FIG. 2A according to exemplary embodiments. The information processing system 1300 includes a mobile device or a computer. For example, the information processing system 1300 may include a modem 1320, a central processing unit 1330, a RAM 1340, and a user interface 1350. The memory system 1310 may include a memory 1311 and a memory controller 1312 and have substantially the same configuration as that of the memory card 1200 in FIG. 8A. The memory system 1310 stores data processed by the central processing unit 1330 or data input from the outside. The information processing system 1300 may be provided as a memory card, a semiconductor device disk, a camera image sensor, and other application chipsets. For example, the memory system 1310 may be realized as a solid state drive (SSD). In this case, the information processing system 1300 may stably store large data in the memory system 1310.

According to some exemplary embodiments, a gap between the semiconductor device and the package substrate can be flexibly set up due to the stacked solder bump. The volume of the solder bump can be lowered and a fine pitch can be accomplished such that an I/O integration may be improved. Moreover, the mechanical and electrical characteristics may be improved due the intermediate layer which can reduce deformation and fracture of the solder bumps.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor device comprising:
a bump stack that is electrically connected to a chip pad formed on a substrate, wherein the bump stack comprises;
a first solder bump and a second solder bump which are stacked on the chip pad; and
a metal layer interposed between the first and second solder bumps, the metal layer having a melting point greater than the first and second solder bumps,
wherein the metal layer has a disk shape which includes a bottom surface adjacent to the first solder bump, a top surface adjacent to the second solder bump, and a side surface connecting the top surface to the bottom surface, and
wherein at least one of the top and bottom surfaces is stepped, such that the at least one of the top and bottom surfaces has a first surface and a second surface, said first surface being offset vertically from the second surface and substantially parallel to the second surface.

2. The semiconductor device of claim 1, wherein the side surface is vertical.

3. The semiconductor device of claim 1, wherein the first solder bump comprises solder having a melting point identical to that of solder for the second solder bump.

4. The semiconductor device of claim 1, wherein one of the first and second solder bumps comprises solder having a melting point less than that of solder for the other.

5. The semiconductor device of claim 1, further comprising an intermetallic compound layer interposed between the metal layer and at least one of the first and second solder bumps.

6. A semiconductor device comprising:
a substrate with a chip pad thereon;
a plurality of reflowed separate solder bumps vertically stacked on one another on the chip pad; and
a stepped metal layer between the plurality of reflowed separate solder bumps, the stepped metal layer including at least one metal material different from the plurality of solder bumps,
wherein the stepped metal layer has a top and a bottom surface, and
wherein at least one of the top and bottom surfaces is stepped, such that the at least one of the top and bottom surfaces has a first surface and a second surface, said first surface being offset vertically from the second surface and substantially parallel to the second surface.

7. The device of claim 6 wherein at least one of the plurality of reflowed separate solder bumps comprises a flattened reflowed solder bump.

8. The device of claim 6 wherein a first one of the plurality of reflowed separate solder humps includes a first curved outer vertical sidewall and a second one of the plurality of reflowed separate solder bumps includes a second curved outer vertical sidewall that curves more than the first curved outer vertical sidewall.

9. The device of claim 8 wherein the first one of the plurality of reflowed separate solder bumps is entasis pillar shaped.

10. The device of claim 9 wherein the second one of the plurality of reflowed separate solder bumps is bead shaped.

11. The device of claim 6 wherein a melting point of the stepped metal layer is greater than those of the plurality of reflowed separate solder bumps.

12. The device of claim 6 wherein respective melting points of ones the plurality of reflowed separate solder bumps are different from one another.

13. The device of claim 6 wherein respective melting points of ones the plurality of reflowed separate solder bumps are equal to one another.

14. The semiconductor device of claim 1, wherein the stepped metal layer is a noble metal.

15. The device of claim 6, wherein the stepped metal layer is a noble metal.

16. The device of claim 6, wherein the plurality of reflowed separate solder bumps comprises at least three reflowed separate solder bumps.

17. The semiconductor device of claim 1, wherein the first surface is an outer surface and the second surface is an inner surface, and
wherein the inner surface is depressed relative to the outer surface.

18. The semiconductor device of claim 6, wherein the first surface is an outer surface and the second surface is an inner surface, and
wherein the inner surface is depressed relative to the outer surface.

* * * * *